(12) United States Patent
Freebern

(10) Patent No.: US 7,447,107 B2
(45) Date of Patent: Nov. 4, 2008

(54) RANDOM ACCESS MEMORY INCLUDING MULTIPLE STATE MACHINES

(75) Inventor: Margaret Clark Freebern, Richmond, VT (US)

(73) Assignee: Qimonda North America Corp., Cary, NC (US)

( * ) Notice: Subject to any disclaimer, the term of this patent is extended or adjusted under 35 U.S.C. 154(b) by 117 days.

(21) Appl. No.: 11/453,946

(22) Filed: Jun. 15, 2006

(65) Prior Publication Data

US 2007/0297268 A1 Dec. 27, 2007

(51) Int. Cl.
*G11C 8/00* (2006.01)
(52) U.S. Cl. ............. 365/233.11; 365/191; 365/233.13; 365/233.1
(58) Field of Classification Search .................. 365/191, 365/233.11, 233.1, 233.13
See application file for complete search history.

(56) References Cited

U.S. PATENT DOCUMENTS

| | | | |
|---|---|---|---|
| 5,893,136 A * | 4/1999 | Stolt et al. ............. | 365/189.08 |
| 6,094,375 A | 7/2000 | Lee | |
| 6,282,128 B1 | 8/2001 | Lee | |
| 6,438,066 B1 | 8/2002 | Ooishi et al. | |
| 6,754,133 B2 | 6/2004 | Morita et al. | |
| 2004/0008069 A1 * | 1/2004 | Welker et al. ............. | 327/278 |
| 2004/0123036 A1 * | 6/2004 | Hammitt et al. ............. | 711/131 |
| 2006/0294443 A1 * | 12/2006 | Fekih-Romdhane ........ | 714/738 |

* cited by examiner

*Primary Examiner*—Thong Q Le
(74) *Attorney, Agent, or Firm*—Dicke, Billig & Czaja, PLLC

(57) ABSTRACT

A random access memory including multiple state machines and selection circuitry. The multiple state machines include a first state machine and a second state machine, and possibly more state machines. The first state machine is configured to provide first signals to control the random access memory and provide first command operations and the second state machine is configured to provide second signals to control the random access memory and provide second command operations. The selection circuitry selects one of the multiple state machines. The selection circuitry conducts the first signals to select the first state machine and provide the first command operations and the selection circuitry conducts the second signals to select the second state machine and provide the second command operations.

21 Claims, 3 Drawing Sheets

US 7,447,107 B2

RANDOM ACCESS MEMORY INCLUDING MULTIPLE STATE MACHINES

BACKGROUND

Typically, an electrical system includes a number of circuits that communicate with one another to perform system applications. The circuits can be on the same integrated circuit chip or on separate integrated circuit chips. Often, the electrical system includes one or more controllers, such as a micro-processor, and one or more memory devices, such as a random access memory (RAM) device. The controller communicates with the memory to store data and to read the stored data.

The RAM can be any suitable type of RAM, such as a single data rate dynamic RAM (SDR-DRAM), a double data rate synchronous DRAM (DDR-SDRAM), or a graphics double data rate SDRAM (GDDR-SDRAM). Also, the RAM can be any suitable generation of RAM, including double data rate two SDRAM (DDR2-SDRAM) and higher generations of DRAM. Usually, each new generation of DRAM performs different command operations and operates at an increased data rate from the previous generation. A state machine can be used to control a DRAM and provide the command operations and features of a DRAM type and generation.

Customers choose the DRAM they need based on characteristics such as data rates, memory sizes, and features needed for their applications. Fluctuating customer demands make it difficult to predict which features, data rates, and sizes will result in the largest profit to the manufacturer. As a result, manufacturers provide an ever increasing variety of DRAMs to the marketplace. Manufacturers supply DRAMs having different data rates, memory sizes, and features to meet the ever increasing number and variety of system applications, such as consumer and mobile applications, graphic applications, personal computer applications, and server applications.

While some DRAM suppliers have the resources to design many different DRAM chips and offer the customer a wide variety of devices, other suppliers have a smaller or more limited amount of resources for creating a broad product portfolio and maximizing profits.

For these and other reasons there is a need for the present invention.

SUMMARY

One aspect of the present invention provides a random access memory including multiple state machines and selection circuitry. The multiple state machines include a first state machine and a second state machine, and possibly more state machines. The first state machine is configured to provide first signals to control the random access memory and provide first command operations and the second state machine is configured to provide second signals to control the random access memory and provide second command operations. The selection circuitry selects one of the multiple state machines. The selection circuitry conducts the first signals to select the first state machine and provide the first command operations and the selection circuitry conducts the second signals to select the second state machine and provide the second command operations.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
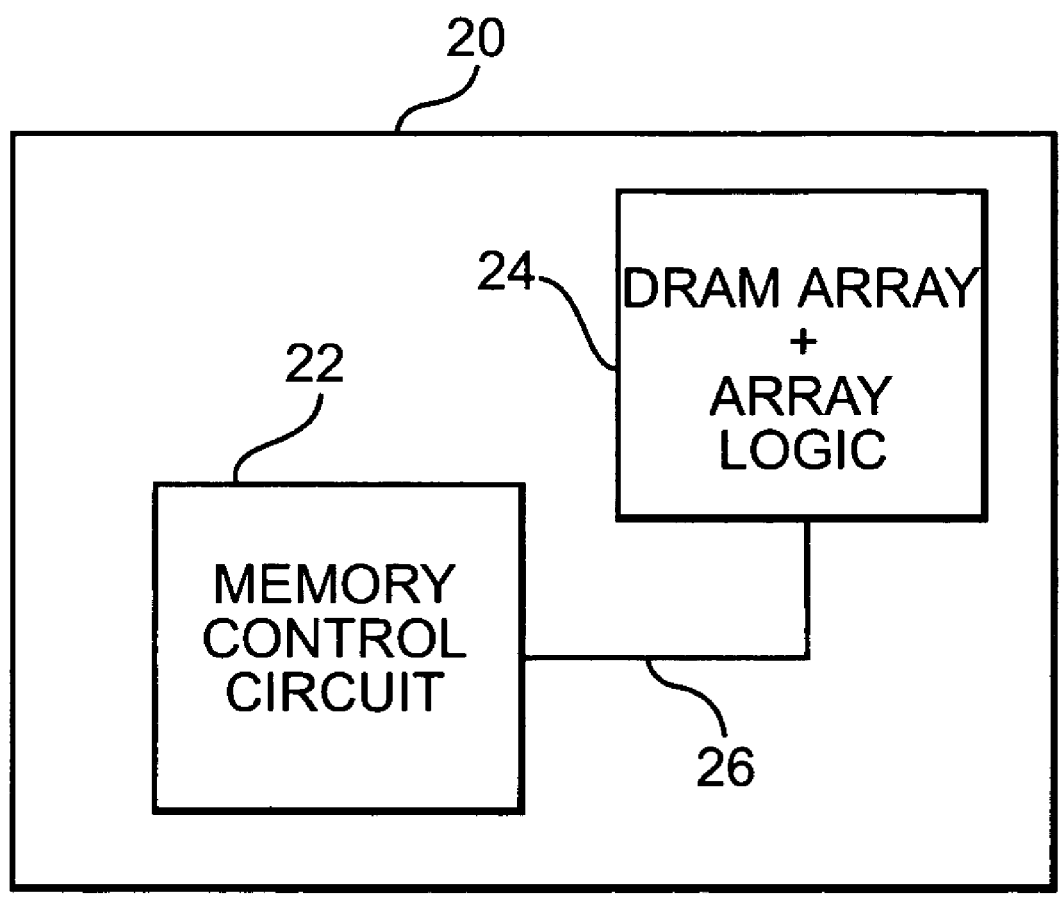
FIG. 1 is a diagram illustrating one embodiment of an integrated circuit according to the present invention.

FIG. 1 is a diagram illustrating one embodiment of an integrated circuit 20 according to the present invention. Integrated circuit 20 includes DRAM circuitry to provide a DRAM memory and a variety of DRAM types or DRAM generations in one integrated circuit chip. The DRAM circuitry provides multiple command operation sets, where each set of command operations provides one DRAM type and generation and is different than the other sets of command operations. Offering multiple sets of command operations in a single integrated circuit chip reduces overhead costs while offering the customer a range of DRAM solutions. In operation, one of the sets of command operations is selected and the other sets of command operations are not selected.

In one embodiment, integrated circuit 20 is configured to provide SDR-DRAM command operations and DDR-SDRAM command operations. In one embodiment, integrated circuit 20 is configured to provide DDR-SDRAM command operations and DDR2-SDRAM command operations. In one embodiment, integrated circuit 20 is configured to provide SDR-DRAM command operations, DDR-SDRAM command operations, and DDR2-SDRAM command operations. In other embodiments, integrated circuit 20 is configured to provide any suitable number of different command operation sets. In other embodiments, integrated circuit 20 is configured to provide any suitable command operation sets and any suitable DRAM type and generation.

Integrated circuit 20 includes a memory control circuit 22 and a DRAM array and array logic 24. Memory control circuit 22 is electrically coupled to DRAM array and array logic 24 via array communications path 26. In one embodiment, integrated circuit 20 is a DRAM chip. In one embodiment, integrated circuit 20 is an application specific integrated circuit (ASIC) chip that includes memory control circuit 22, DRAM array and array logic 24, and other circuitry, such as a host controller.

Memory control circuit 22 is configured to control read operations from and write operations into DRAM array and array logic 24 and to provide a variety of DRAM command operation sets. Memory control circuit 24 includes multiple state machines, i.e., two or more state machines. Each of the state machines provides state machine signals to control DRAM array and array logic 24 and provide command operations that corresponds to the state machine. Also, memory control circuit 22 includes selection circuitry that selects one of the state machines to control operation of DRAM array and array logic 24. The selection circuitry conducts output signals from a state machine to select the state machine and provide command operations that correspond to the selected state machine.

In one embodiment, the selection circuitry is substantially a multiplexer circuit, wherein the selection circuitry conducts output signals from a state machine to select the state machine and does not conduct output signals from other state machines, which de-selects the other state machines. In one embodiment, two or more of the multiple state machines share one or more functions from one of the state machines or from shared circuitry in the memory control circuit 22.

In one embodiment, the selection circuitry includes masked metal lines that select and deselect state machines. In one embodiment, the selection circuitry includes programmable fuses. In one embodiment, the selection circuitry includes a programmable register. In other embodiments, the selection circuitry can be any suitable selection circuit.

Figure 2:
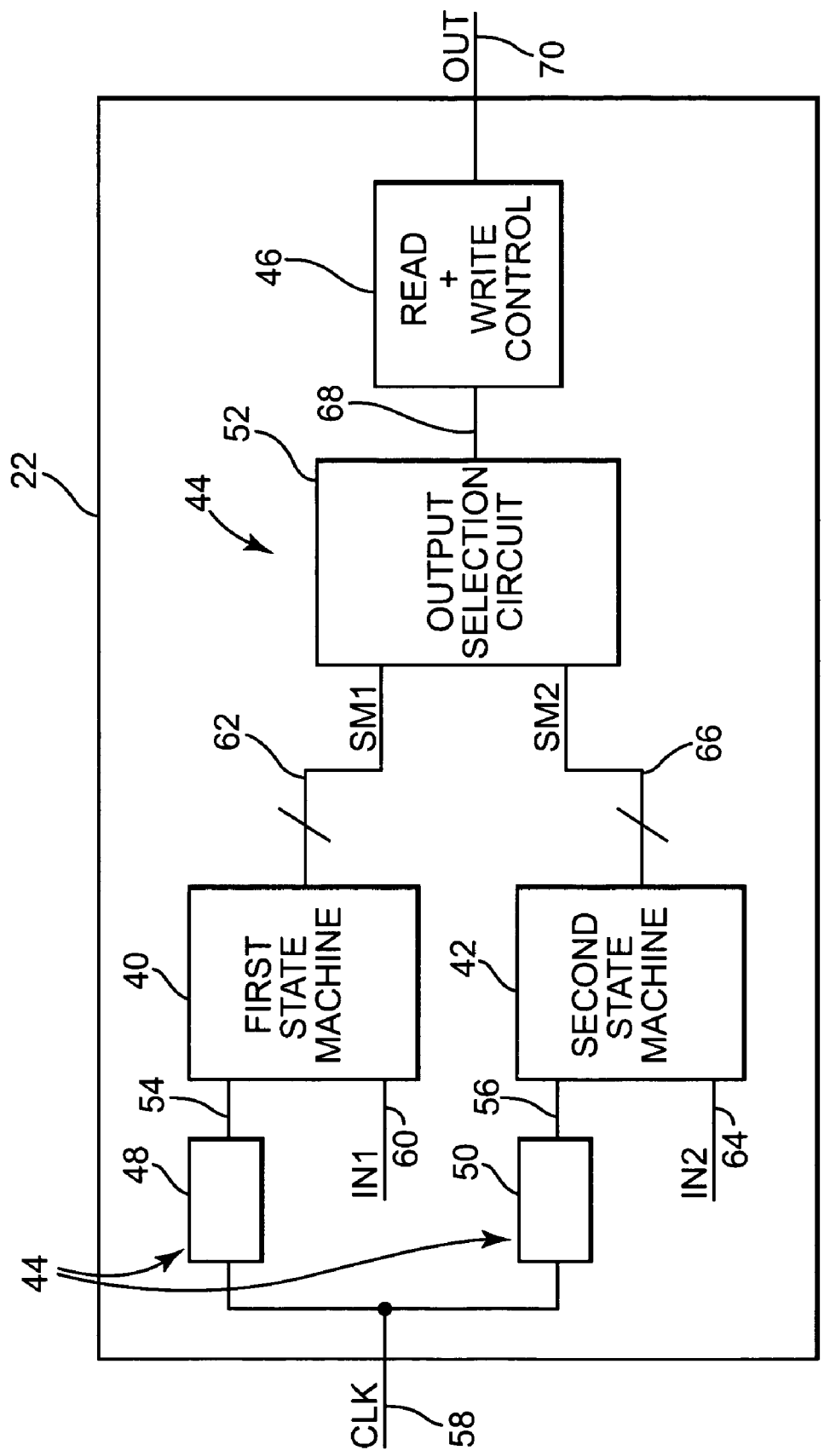
FIG. 2 is a block diagram illustrating one embodiment of a memory control circuit.

FIG. 2 is a block diagram illustrating one embodiment of memory control circuit 22, which controls read and write operations in integrated circuit 20. Memory control circuit 22 is configured to control integrated circuit 20 and to provide a variety of command operation sets in one integrated circuit chip. Memory control circuit 22 controls DRAM array and array logic 24 to provide a selected one of the sets of command operations.

Memory control circuit 22 includes a first state machine 40, a second state machine 42, selection circuitry 44, and a read and write control circuit 46. Memory control circuit 22 is configured to provide two command operation sets, where each of the first and second state machines 40 and 42 is configured to provide state machine signals and one of the two command operation sets. In other embodiments, memory control circuit 22 can include a third state machine to provide a third command operation set. In other embodiments, memory control circuit 22 can include any suitable number of state machines to provide any suitable number of command operation sets.

Each of the first and second state machines 40 and 42 is configured to control basic read and write functions and other functions, such as read and write functions that are interrupted by other read and write commands or burst terminate commands. Each of the first and second state machines 40 and 42 receives inputs such as a clock signal, the decoded and latched read and write commands, the burst start signal that accounts for internal read and write latency, the burst end signal that indicates when a burst has completed, a decoded and latched burst terminate command, and an enable signal that indicates the read or write operation is occurring to a bank that has been activated or opened. Also, each of the first and second state machines 40 and 42 outputs the read or write state of the chip to control the data flow direction in the data path and in the column path, and clocking signals that control other aspects of read and write operations including the address counter and address FIFO.

In one embodiment, one of the first and second state machines 40 and 42 is configured to provide SDR-DRAM command operations and the other of the first and second state machines 40 and 42 is configured to provide DDR-SDRAM command operations. In one embodiment, one of the first and second state machines 40 and 42 is configured to provide DDR-SDRAM command operations and the other of the first and second state machines 40 and 42 is configured to provide DDR2-SDRAM command operations. In other embodiments, one of the first and second state machines 40 and 42 is configured to provide any suitable command operation set and the other is configured to provide any other suitable command operation set. In other embodiments, memory control circuit 22 includes a third state machine and one of the three state machines is configured to provide SDR-DRAM command operations, another is configured to provide DDR-SDRAM command operations, and another is configured to provide DDR2-SDRAM command operations. In other embodiments, memory control circuit 22 includes any suitable number of state machines to provide any suitable number of different sets of command operations and any suitable DRAM types and generations.

Selection circuitry 44 includes a first clock enable circuit 48, a second clock enable circuit 50, and an output selection circuit 52. First clock enable circuit 48 is electrically coupled to first state machine 40 via first clock path 54, and second clock enable circuit 50 is electrically coupled to second state machine 42 via second clock path 56. First clock enable circuit 48 receives clock signal CLK at 58 and, if enabled, provides the received clock signal to first state machine 40. If not enabled, first clock enable circuit 48 does not provide the received clock signal to first state machine 40. Second clock enable circuit 50 receives clock signal CLK at 58 and, if enabled, provides the received clock signal to second state machine 42. If not enabled, second clock enable circuit 50 does not provide the received clock signal to second state machine 42. In one embodiment, first clock enable circuit 48 is enabled and second clock enable circuit 50 is not enabled as part of selecting first state machine 40, and first clock enable circuit 48 is not enabled and second clock enable circuit 50 is enabled as part of selecting second state machine 42. Providing clock signal CLK to only one of the first and second state machines 40 and 42 reduces power consumption of memory control circuit 22 and integrated circuit 20.

First state machine 40 receives clock signals at 54 via first clock enable circuit 48 and input signals IN1 at 60 and provides first state machine output signals SM1 at 62. First state machine 40 is electrically coupled to output selection circuit 52 via first output signal bus 62. Second state machine 42 receives clock signals at 56 via second clock enable circuit 50 and input signals IN2 at 64 and provides second state machine output signals SM2 at 66. Second state machine 42 is electrically coupled to output selection circuit 52 via second output signal bus 66. In one embodiment, the number of first state machine output signals SM1 at 62 is different than the number of second state machine output signals SM2 at 66. Also, in one embodiment, the number of conductive paths in first output signal bus 62 is different than the number of conductive paths in first output signal bus 66.

Output selection circuit 44 receives first state machine output signals SM1 at 62 and second state machine output signals SM2 at 66 and provides selected output signals at 68. Output selection circuit 44 is electrically coupled to read and write control circuit 46 via output signal bus 68. In one embodiment, output selection circuit 44 selects first state machine output signals SM1 at 62 to select first state machine 40 and output selection circuit 44 selects second state machine output signals SM2 at 66 to select second state machine 42.

In one embodiment, selection circuitry 44 is implemented via masked metal lines, such as first layer metal lines, produced during manufacturing of integrated circuit 20. The masked metal lines provide clock signal CLK at 58 to one of the first and second state machines 40 and 42. Also, the masked metal lines provide either the first state machine output signals SM1 at 62 or the second state machine output signals SM2 at 66 to read and write control circuit 46 to select one of the first and second state machines 40 and 42 and provide a selected set of command operations. In one embodiment, selection circuitry 44 includes programmable fuses that are opened or closed during testing of integrated circuit 20 to select one of the first and second state machines 40 and 42 and provide a selected set of command operations. In one embodiment, selection circuitry 44 includes programmable registers that are programmed at any suitable time to select one of the first and second state machines 40 and 42 and provide a selected set of command operations. In one embodiment, selection circuitry includes a multiplexer controlled to select one of the first and second state machines 40 and 42 and provide a selected set of command operations. In one embodiment, selection circuitry 44 can be implemented via wire bonding.

Read and write control circuit 46 receives the selected output signals at 68 and provides control output signals OUT at 70 to provide command operations or functions, i.e. functional control, that corresponds to the selected one of the first and second state machines 40 and 42. Read and write control circuit 46 provides control output signals OUT at 70 to control DRAM array and array logic 24. Read and write control circuit 46 controls the read or write direction of the data paths, generates the column access strobe (CAS) and read or write signal for the column path, and generates other clocks that control timings for items such as the column address during read and write operations.

In other embodiments, memory control circuit 22 includes shared state machine function circuitry that operates if either first state machine 40 or second state machine 42 is selected. In one embodiment, the shared state machine function circuitry, which provides one or more shared state machine functions, is included in one of the first and second state machines 40 and 42 and clock signal CLK at 58 is provided as needed to the shared state machine function circuitry. In one embodiment, the shared state machine function circuitry, which provides one or more shared state machine functions, is provided separate from either of the first and second state machines 40 and 42.

Putting multiple state machines, such as first and second state machines 40 and 42, in parallel is a relatively low risk way of adding variety and flexibility to a manufacturer's product line. Designing multiple command operation sets into an integrated circuit, such as integrated circuit 20, is simplified via putting the state machines in parallel. For example, some operations are allowed in SDR-DRAM but not allowed or not required in DDR-SDRAM. To modify one state machine to account for these command differences would be a tedious and risky design challenge. Placing two verified state machines in parallel involves less design work, less verification, and less risk.

Figure 3:
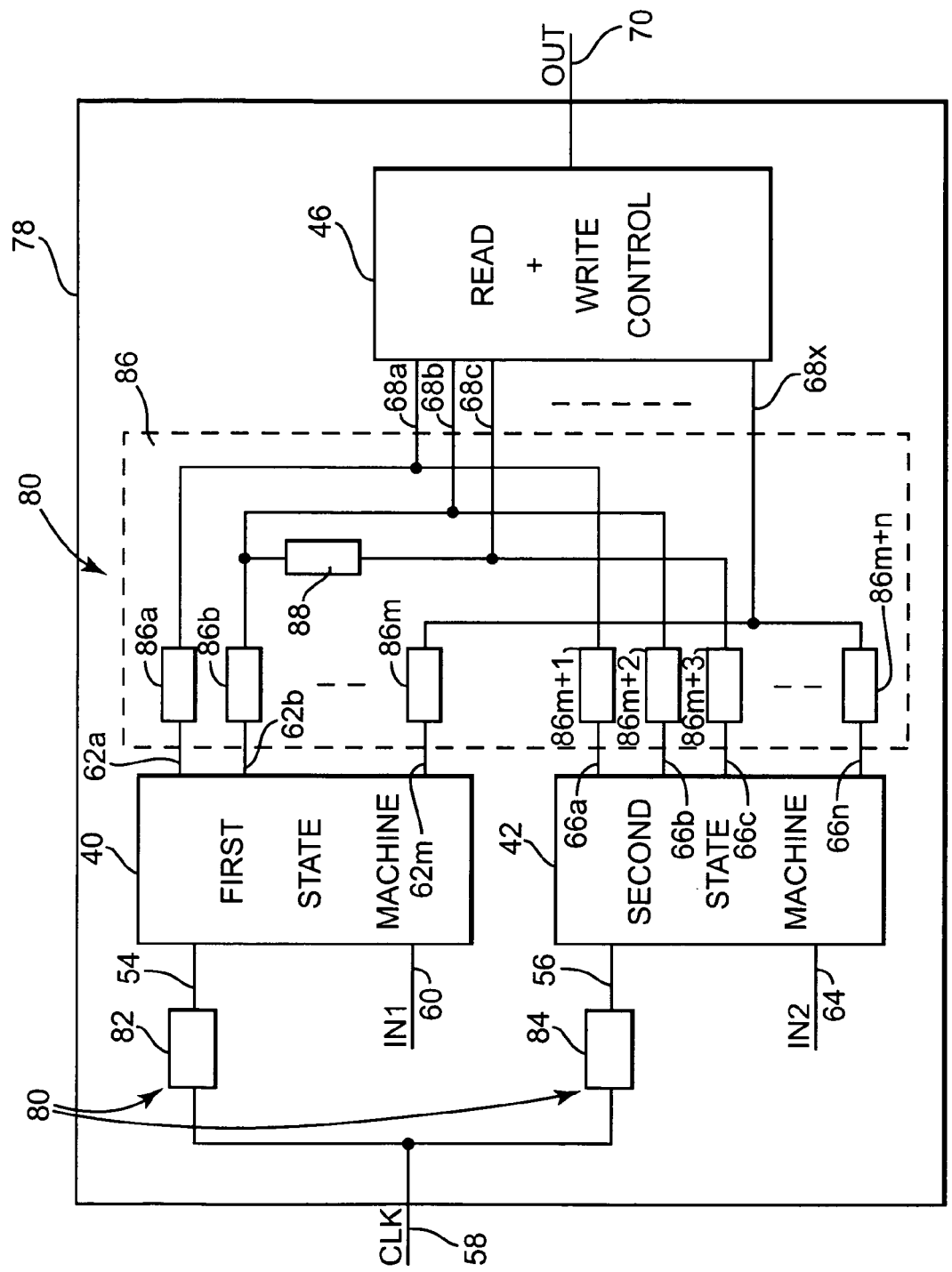
FIG. 3 is a diagram illustrating one embodiment of a memory control circuit and selection circuitry.

FIG. 3 is a diagram illustrating one embodiment of a memory control circuit 78 that includes selection circuitry 80. Memory control circuit 78 controls read and write operations in an integrated circuit, such as integrated circuit 20, to provide a variety of DRAM command operation sets in one integrated circuit chip. Memory control circuit 78 is similar to memory control circuit 22.

Memory control circuit 78 includes first state machine 40, second state machine 42, and read and write control circuit 46, which are described above in reference to FIG. 2. Memory control circuit 78 is configured to provide two sets of command operations, where each of the first and second state machines 40 and 42 is configured to provide state machine signals to provide one of the two sets of command operations. In other embodiments, memory control circuit 78 can include a third state machine to provide a third set of command operations. In other embodiments, memory control circuit 78 can include any suitable number of state machines to provide any suitable number of sets of command operations.

Selection circuitry 80 includes a first clock enable circuit 82, a second clock enable circuit 84, and an output selection circuit 86. First clock enable circuit 82 is electrically coupled to first state machine 40 via first clock path 54, and second clock enable circuit 84 is electrically coupled to second state machine 42 via second clock path 56.

Output selection circuit 86 includes output signal enable circuits 86a-86m and 86m+1-86m+n, and a second layer output signal enable circuit 88. Output selection circuit 86 includes any suitable number of output signal enable circuits 86a-86m and any suitable number of output signal enable circuits 86m+1-86m+n. Also, output selection circuit 86 includes any suitable number of second layer output signal enable circuits, such as second layer output signal enable circuit 88.

Output signal enable circuits 86a-86m are electrically coupled to first state machine 40 via conductive paths 62a-62m in first output signal bus 62. Output signal enable circuit 86a is electrically coupled to first state machine 40 via conductive path 62a, output signal enable circuit 86b is electrically coupled to first state machine 40 via conductive path 62b, and so on up to output signal enable circuit 86m that is electrically coupled to first state machine 40 via conductive path 62m. Output signal enable circuits 86m+1-86m+n are electrically coupled to second state machine 42 via conductive paths 66a-66n in second output signal bus 66. Output signal enable circuit 86m+1 is electrically coupled to second state machine 42 via conductive path 66a, output signal enable circuit 86m+2 is electrically coupled to second state machine 42 via conductive path 66b, output signal enable circuit 86m+3 is electrically coupled to second state machine 42 via conductive path 66c, and so on up to output signal enable circuit 86m+n that is electrically coupled to second state machine 42 via conductive path 66n.

Output signal enable circuits 86a-86m and 86m+1-86m+n are electrically coupled to read and write control circuit 46 via conductive paths 68a-68x in output signal bus 68. Output signal enable circuits 86a and 86m+1 are electrically coupled to read and write control circuit 46 via conductive path 68a, output signal enable circuits 86b and 86m+2 are electrically coupled to read and write control circuit 46 via conductive path 68b, and output signal enable circuits 86m and 86m+n are electrically coupled to read and write control circuit 46 via conductive path 68x. Also, output signal enable circuit 86m+3 is electrically coupled to read and write control circuit 46 via conductive path 68c and output signal enable circuit 86b is electrically coupled to second layer output signal enable circuit 88 that is electrically coupled to read and write control circuit 46 via conductive path 68c.

First output signal bus 62 includes any suitable number of conductive paths 62a-62m and second output signal bus 66 includes any suitable number of conductive paths 66a-66n. In one embodiment, the number of conductive paths 62a-62m in first output signal bus 62 is different than the number of conductive paths 66a-66n in second output signal bus 66. In one embodiment, the number of conductive paths 62a-62m in first output signal bus 62 is the same as the number of conductive paths 66a-66n in second output signal bus 66.

First clock enable circuit 82, second clock enable circuit 84, output signal enable circuits 86a-86m and 86m+1-86m+n, and second layer output signal enable circuit 88 are implemented via masked metal lines, such as first layer metal lines produced during manufacturing of integrated circuit 20. In other embodiments, selection circuitry 80 includes programmable fuses that are opened or closed during testing of integrated circuit 20 to select one of the first and second state machines 40 and 42. In other embodiments, selection circuitry 80 includes programmable registers that are programmed at any suitable time to select one of the first and second state machines 40 and 42 and provide a selected set of command operations. In other embodiments, selection circuitry 80 includes a multiplexer controlled to select one of the first and second state machines 40 and 42 and provide a selected set of command operations. In other embodiment, at least some of selection circuitry 80 can be implemented via wire bonding.

To select first state machine 40, metal lines are provided in first clock enable circuit 82, output signal enable circuits 86a-86m, and second layer output signal enable circuit 88. Metal lines are not provided in second clock enable circuit 84 and output signal enable circuits 86m+1-86m+n, such that clock enable circuit 84 and output signal enable circuits 86m+1-86m+n are open circuits.

If first state machine 40 is selected, clock signal CLK at 58 is provided to first state machine 40 via first clock enable circuit 82. Also, first state machine output signals are provided to read and write control circuit 46 via output signal enable circuits 86a-86m and second layer output signal enable circuit 88. Second layer output signal enable circuit 88 provides the state machine output signal at 62b to read and write control circuit 46 at 68c. The first state machine output signal at 62a is provided to read and write control circuit 46 at 68a via output signal enable circuit 86a, the first state machine output signal at 62b is provided to read and write control circuit 46 at 68b and 68c via output signal enable circuit 86b, and so on up to the first state machine output signal at 62m is provided to read and write control circuit 46 at 68x via output signal enable circuit 86m.

To select second state machine 42, metal lines are provided in second clock enable circuit 84 and output signal enable circuits 86m+1-86m+n. Metal lines are not provided in first clock enable circuit 82, output signal enable circuits 86a-86m, and second layer output signal enable circuit 88, such that clock enable circuit 82, output signal enable circuits 86a-86m, and second layer output signal enable circuit 88 are open circuits.

If second state machine 42 is selected, clock signal CLK at 58 is provided to second state machine 42 via second clock enable circuit 84. Also, second state machine output signals are provided to read and write control circuit 46 via output signal enable circuits 86m+1-86m+n. The second state machine output signal at 66a is provided to read and write control circuit 46 at 68a via output signal enable circuit 86m+1, the second state machine output signal at 66b is provided to read and write control circuit 46 at 68b via output signal enable circuit 86m+2, the second state machine output signal at 66c is provided to read and write control circuit 46 at 68c via output signal enable circuit 86m+3, and so on up to the second state machine output signal at 66n provided to read and write control circuit 46 at 68x via output signal enable circuit 86m+n.

If first state machine 40 is selected, first state machine 40 receives clock signals at 54 via first clock enable circuit 82 and input signals IN1 at 60 and provides first state machine output signals at 62a-62m. Second state machine 42 does not receive clock signals at 56. Read and write control circuit 46 receives only the first state machine output signals at 68a-68x and provides control output signals OUT at 70 to control integrated circuit 20 and provide command operations that correspond to first state machine 40.

If second state machine 42 is selected, second state machine 42 receives clock signals at 56 via second clock enable circuit 84 and input signals IN2 at 64 and provides second state machine output signals at 66a-66n. First state machine 40 does not receive clock signals at 54. Read and write control circuit 46 receives only the second state machine output signals at 68a-68x and provides control output signals OUT at 70 to control integrated circuit 20 and provide command operations that correspond to second state machine 42. In one embodiment, first state machine 40 is configured to provide SDR-DRAM command operations and second state machine 42 is configured to provide DDR-SDRAM command operations.

Putting multiple state machines, such as first and second state machines 40 and 42, in parallel is a relatively low risk way of adding variety and flexibility to a product line. Offering multiple command operation sets in a single integrated circuit chip reduces overhead costs while offering the customer a wide range of DRAM solutions.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A random access memory, comprising:
    multiple state machines including a first state machine and a second state machine, wherein the first state machine is configured to provide first signals to control the random access memory and provide first command operations that provide a first type and generation of memory and the second state machine is configured to provide second signals to control the random access memory and provide second command operations that provide a second type and generation of memory that is different than the first type and generation of memory; and
    selection circuitry that fully selects only one of the multiple state machines, wherein the selection circuitry conducts the first signals to select the first state machine and provide the first command operations and the selection circuitry conducts the second signals to select the second state machine and provide the second command operations, wherein the first state machine is configured to provide single data rate dynamic random access memory command operations and the second state machine is configured to provide double data rate dynamic random access memory command operations.

2. The random access memory of claim 1, wherein the selection circuitry conducts a clock signal and provides the clock signal to only the selected one of the multiple state machines.

3. The random access memory of claim 1, wherein the selection circuitry conducts one of the first signals to provide the second command operations.

4. The random access memory of claim 1, wherein the first state machine is configured to provide a shared function that is used to provide the second command operations.

5. The random access memory of claim 1, wherein the selection circuitry comprises at least one of masked metal lines, fuses, a multiplexer, and a register configured to be programmed to select one of the first state machine and the second state machine.

6. A random access memory, comprising:
multiple state machines including a first state machine and a second state machine, wherein the first state machine is configured to provide first signals to control the random access memory and provide first command operations that provide a first type and generation of memory and the second state machine is configured to provide second signals to control the random access memory and provide second command operations that provide a second type and generation of memory that is different than the first type and generation of memory; and
selection circuitry that fully selects only one of the multiple state machines, wherein the selection circuitry conducts the first signals to select the first state machine and provide the first command operations and the selection circuitry conducts the second signals to select the second state machine and provide the second command operations, wherein the multiple state machines comprise:
a third state machine configured to provide third signals to control the random access memory and provide third command operations that provide a third type and generation of memory.

7. The random access memory of claim 6, wherein the first state machine is configured to control the random access memory to perform as a single data rate (SDR) memory and the second state machine is configured to control the random access memory to perform as a double data rate (DDR) memory and the third state machine is configured to control the random access memory to perform as a double data rate two (DDR2) memory.

8. An integrated circuit, comprising:
a random access memory array; and
a first control circuit configured to control read operations from and write operations into the random access memory array, the first control circuit comprising:
multiple state machines configured to provide state machine signals, wherein each of the multiple state machines provides a different type and generation of memory;
selection circuitry configured to fully select only one of the multiple state machines and provide output signals that correspond to the one of the multiple state machines; and
a second control circuit configured to receive the output signals and control the read and write operations to provide command operations that correspond to the one of the multiple state machines, wherein the multiple state machines comprise:
a first state machine configured to provide command operations for one of a single data rate (SDR), a double data rate (DDR), and a double data rate two (DDR2) dynamic random access memory; and
a second state machine configured to provide command operations for another one of the single data rate (SDR), the double data rate (DDR), and the double data rate two (DDR2) dynamic random access memory.

9. The integrated circuit of claim 8, wherein the command operations that correspond to the one of the multiple state machines are different than command operations that correspond to another one of the multiple state machines.

10. The integrated circuit of claim 8, comprising a third state machine, wherein:
the first state machine is configured to provide command operations for the single data rate (SDR) dynamic random access memory;
the second state machine is configured to provide command operations for the double data rate (DDR) dynamic random access memory; and
the third state machine is configured to provide command operations for the double data rate two (DDR2) dynamic random access memory.

11. The integrated circuit of claim 8, wherein at least one of the multiple state machines provides a state machine function that is shared with another one of the multiple state machines.

12. The integrated circuit of claim 8, wherein the selection circuitry comprises at least one of masked metal lines, fuses, a multiplexer, and programmable registers.

13. The integrated circuit of claim 8, wherein the selection circuitry is configured to receive a clock signal and provide the received clock signal to the one of the multiple state machines.

14. A random access memory, comprising:
means for providing first signals to control the random access memory and provide first command operations that provide a first type and generation of memory;
means for providing second signals to control the random access memory and provide second command operations that provide a second type and generation of memory that is different than the first type and generation of memory; and
means for selecting only one of the first signals to provide the first command operations and the second signals to provide the second command operations, wherein the means for providing first signals controls the random access memory to provide command operations for one of a single data rate and greater than the single data rate and the means for providing second signals controls the random access memory to provide command operations for another one of the single data rate and greater than the single data rate.

15. The random access memory of claim 14, comprising:
means for receiving a clock signal; and
means for enabling the clock signal to only one of the means for providing first signals and the means for providing second signals.

16. The random access memory of claim 14, wherein the means for providing first signals provides a shared function that is used to provide the second command operations.

17. The random access memory of claim 14, comprising:
means for providing third signals to control the random access memory and provide third command operations that provide a third type and generation of memory.

18. A method for providing multiple command operation sets in a random access memory, comprising:
providing first signals to control the random access memory and provide first command operations that provide a first type and generation of memory;

providing second signals to control the random access memory and provide second command operations that provide a second type and generation of memory that is different than the first type and generation of memory; and selecting only one of the first signals to provide the first command operations and the second signals to provide the second command operations, wherein providing first signals comprises providing command operations for one of a single data rate and greater than the single data rate and providing second signals comprises providing command operations for another one of the single data rate and greater than the single data rate.

19. The method of claim 18, comprising:

receiving a clock signal; and enabling one of the clock signal to provide only the first signals and the clock signal to provide only the second signals.

20. The method of claim 18, comprising:

providing a shared signal to provide first command operations and second command operations.

21. The method of claim 18, comprising:

providing third signals to control the random access memory and provide third command operations that provide a third type and generation of memory.

* * * * *